United States Patent
Anandarajah et al.

(10) Patent No.: US 9,385,506 B2
(45) Date of Patent: Jul. 5, 2016

(54) WAVELENGTH TUNABLE COMB SOURCE

(75) Inventors: Prince Anandarajah, Swords (IE); Sylwester Latkowski, Royal Canal Park (IE); Liam Barry, Clontarf (IE)

(73) Assignee: Dublin City University (IE)

( * ) Notice: Subject to any disclaimer, the term of this patent is extended or adjusted under 35 U.S.C. 154(b) by 0 days.

(21) Appl. No.: 14/343,675

(22) PCT Filed: Sep. 12, 2012

(86) PCT No.: PCT/EP2012/067824
§ 371 (c)(1),
(2), (4) Date: Jul. 7, 2014

(87) PCT Pub. No.: WO2013/037819
PCT Pub. Date: Mar. 21, 2013

(65) Prior Publication Data
US 2014/0314108 A1    Oct. 23, 2014

(30) Foreign Application Priority Data
Sep. 12, 2011    (GB) .................................. 1115742.7

(51) Int. Cl.
*H01S 5/065* (2006.01)
*H01S 5/40* (2006.01)
*H04B 10/50* (2013.01)
*H01S 5/00* (2006.01)
*H01S 5/042* (2006.01)
*H01S 5/10* (2006.01)

(52) U.S. Cl.
CPC .............. *H01S 5/065* (2013.01); *H01S 5/0656* (2013.01); *H01S 5/40* (2013.01); *H01S 5/4006* (2013.01); *H04B 10/506* (2013.01); *H01S 5/0064* (2013.01); *H01S 5/0085* (2013.01); *H01S 5/0427* (2013.01); *H01S 5/1096* (2013.01)

(58) Field of Classification Search
CPC ......... H01S 5/065; H01S 5/0656; H01S 5/40; H01S 5/4006; H01S 5/1096; H01S 5/0064; H01S 5/0427; H01S 5/0085
USPC ................. 372/20, 25, 29.01, 29.015, 29.022
See application file for complete search history.

(56) References Cited

U.S. PATENT DOCUMENTS

| | | | |
|---|---|---|---|
| 2006/0120417 A1 | 6/2006 | Wang et al. | |
| 2007/0206951 A1* | 9/2007 | Lin ................... | H04B 10/25758 398/115 |
| 2012/0140783 A1* | 6/2012 | Yeh ....................... | H01S 5/4062 372/20 |

FOREIGN PATENT DOCUMENTS

JP    2006337833    12/2006

OTHER PUBLICATIONS

Zhou et al. (40nm Wavelength Tunable Gain-Switched Optical Comb Source Jul. 27, 2011) ECOC Technical Digest 2011 OSA.*
International Search Report for corres. PCT/EP2012/067824, completed Nov. 30, 2012 by Hermann Gnugesser of the EPO.
(Continued)

*Primary Examiner* — Dung Nguyen
(74) *Attorney, Agent, or Firm* — Tarolli, Sundheim, Covell & Tummino LLP (57) ABSTRACT

The present application provides an optical comb source in which the comb is produced by seeding a gain switched Fabry-Pérot laser with light from a single mode laser, while at the same time driving the Fabry-Pérot laser with a DC bias and RF signal.

19 Claims, 6 Drawing Sheets

(56) References Cited

OTHER PUBLICATIONS

Anandarajah, et al.: "*Generation of Coherent Multicarrier Signals by Gain Switching of Discrete Mode Lasers*"; IEEE Photonics Journal, vol. 3, No. 1, Feb. 2011, pp. 111-122.

Latkowski, et al.: "*Optical Comb Generation and Expansion by Gain Switched Discrete Mode Laser Diode*"; Lasers and Electro-Optics Europe (CLEO Europe/Eqec), 2011 Conference on and 12th European Quantum Electronics Conference, IEEE, May 22, 2011, p. 1, XP031954837, DOI: 10.1109/CLEOE.2011.5942982 ISBN: 978-1-4577-0533-5, entire document.

Matsui, et al.: "*Generation of Wavelength Tunable Gain-Switched Pulses from FP MQW Lasers with External Injection Seeding*"; IEEE Photonics Technology Letters, vol. 9, No. 8, Aug. 1997, XP011048852, ISSN: 1041-1135, pp. 1087-1089, Figs. 1, 3.

Teshima, et al.: "*Accurate Frequency Control of a Mode-Locked Laser Diode by Reference-Light Injection*"; Optics Letters, OSA, Optical Society of America, Washington, DC, US, vol. 22, No. 2, Jan. 15, 1997, pp. 126-128, XP000679194, ISSN: 0146-9592, abstract, Figs. 1-5.

Zhou, et al.: "*40nm Wavelength Tunable Gain-Switched Optical Comb Source*"; Technical Digest ECOC 2011, Jul. 27, 2011, pp. 1-3, XP002688295, ISBN: 978-1-55752-932-9, Retrieved from the internet @ http://ieeexplore.ieee.org/stamp/stamp.jsp?arnumber=06066013, entire document.

Zhou, et al. 2: "*40nm Wavelength Tunable Gain-Switched Optical Comb Source*"; Optics Express, vol. 19, No. 26, Dec. 12, 2011, p. B415-B420, XP055045968, ISSN: 1094-4087, DOI: 10.1364.OE.19.00B415, entire document.

\* cited by examiner

WAVELENGTH TUNABLE COMB SOURCE

RELATED APPLICATIONS

The present invention claims priority from PCT/EP2012/067824, filed 12 Sep. 2012; which claims priority from GB 1115742.7, filed 12 Sep. 2011, both herein incorporated by reference in their entirety.

FIELD

The present application relates generally to the field of lasers and more specifically to providing an optical comb source.

BACKGROUND OF THE INVENTION

An optical comb source is a coherent multi-carrier signal with equal spacings between adjacent carriers. Optical frequency comb sources have recently stirred a lot of interest due to wide ranging applications such as optical arbitrary waveform generation, photonic microwave signal generation, optical signal processing and multicarrier spectrally efficient transmission techniques with the sub-channel spacing equal to the symbol rate of each sub-channel. Optical frequency comb sources with good spectral flatness, stability, low linewidth and wavelength flexibility are highly desirable for such applications.

One of the conventional approaches used in realizing a comb source is based on mode-locked semiconductor lasers (MLL), for which an example is A. Akrout, A. Shen, R. Brenot, F. Van Dijk, O. Legouezigou, F. Pommereau, F. Lelarge, A. Ramdane and G-H. Duan, "Error-free transmission of 8 WDM channels at 10 Gbit/s using comb generation in a quantum dash based mode-locked laser," ECOC, Th3.D.4, September 2008. Although this technique can generate multi-carrier signals spanning over a wide bandwidth, it inherently suffers from cavity complexity and does not offer the free spectral range (FSR) tunability since the comb line spacing is fixed by the cavity length of the laser. Moreover, the optical linewidth of the individual comb lines can be relatively large (several MHz) preventing higher order (or low baud rate) advanced modulation formats to be imposed. More recently wavelength tunable comb generation by use of external optical modulators has been reported where the line spacing and the central wavelength of the comb can both be varied [T. Sakamoto, T. Kawanishi and M. Izutsu, "Widely wavelength-tunable ultra-flat frequency comb generation using conventional dual-drive Mach-Zehnder modulator," Electron. Lett. 43(19), 1039-1040 (2007). However, the large insertion loss of the modulator (especially when cascaded) coupled with the modulation efficiency can prove prohibitive. Another technique employed, as described in S. Bennett B. Cai, E. Burr, O. Gough, and A. J. Seeds, "1.8-THz Bandwidth, Zero-Frequency Error, Tunable Optical Comb Generator for DWDM Applications," IEEE Photon. Technol. Lett., 11(5), 551-553 (1999) entails the use of phase modulation in an amplified fiber loop with the main disadvantages being poor spectral flatness and the limited optical linewidth of the laser source in order to suppress Brillouin induced instabilities in the comb spectra.

The present application is directed at providing an alternative to these techniques.

SUMMARY

Accordingly, a first embodiment of the application provides a comb source as detailed in claim 1. The application also provides a method as detailed in claim 13. Advantageous embodiments are provided in the dependent claims.

In a first arrangement, a wavelength tunable optical comb source is provided comprising a multi-modal semiconductor laser having a lasing cavity; an RF source providing a RF signal for gain switching of the multi-modal semiconductor laser; and a tunable single mode laser, wherein the comb source is configured that the output from the single mode laser is injected into the lasing cavity of the multi-modal semiconductor laser and where the output of the comb source is provided by the multi-modal semiconductor laser.

Suitably, the multi-modal semiconductor laser is a Fabry-Pérot laser.

The comb source may further comprise an optical circulator comprising at least three ports, the optical circulator being optically coupled to the tunable single mode laser at a first port and optically coupled to the multi-modal semiconductor laser at a second port with the output from the comb source provided from a third port. A polarization controller may be positioned between the tunable single mode laser and the first port for adjusting the polarization of the light from the tunable single mode laser.

Suitably, the comb source is configured to prevent light from the multi-modal semiconductor laser passing to the single mode laser. The comb source may be configured to allow light to enter the cavity of the multi-modal semiconductor laser through the rear facet of the multi-modal semiconductor laser.

The RF source may be provided as a drive signal to the multi-modal semiconductor laser with a bias signal through a bias Tee.

The comb source may comprise a temperature control device for maintaining an operating temperature of the multi-modal semiconductor laser. In this case, the comb source may be configured to provide course tuning of the multi-modal semiconductor laser by selection of the output wavelength of the tunable single mode laser and fine tuning is provided using the temperature control device to adjust the operating temperature of the multi-modal semiconductor laser.

The comb source may further comprise a phase modulator for modulating the comb output with the RF signal from the RF source. In this case, a polarization controller may be provided for adjusting the polarization of the comb output before the phase modulator. An RF delay may be provided for delaying the RF signal provided to the phase modulator.

In another arrangement, the application provides a method for providing a wavelength tunable optical comb comprising the steps of: a) gain switching a multi-modal semiconductor laser with an RF signal; b) seeding the multi-modal semiconductor laser with light from a tunable single mode, wherein the output from the multi-modal semiconductor laser provides the optical comb.

Suitably, the multi-modal semiconductor laser is a Fabry-Pérot laser.

Other advantages, features and benefits will become apparent from the description which follows.

BRIEF DESCRIPTION OF THE DRAWINGS

The present application will now be described with reference to the accompanying drawings in which.

DETAILED DESCRIPTION OF THE DRAWINGS

The present application is directed to providing an optical comb source which depending on the application may or may not be tunable. An optical comb source is a comb source which produces components which are centred in the optical spectrum.

An optical frequency comb is an optical spectrum, emitted by a single laser beam, which consists of phase correlated, equidistant lines centred at an optical frequency. The spacing between the lines is determined by the RF modulation frequency. Frequency combs are simple and compact systems that phase coherently connect the radio frequency domain (below 100 GHz) with the optical domain (above 140 THz). They also greatly simplify high precision optical frequency measurements.

Figure 1:
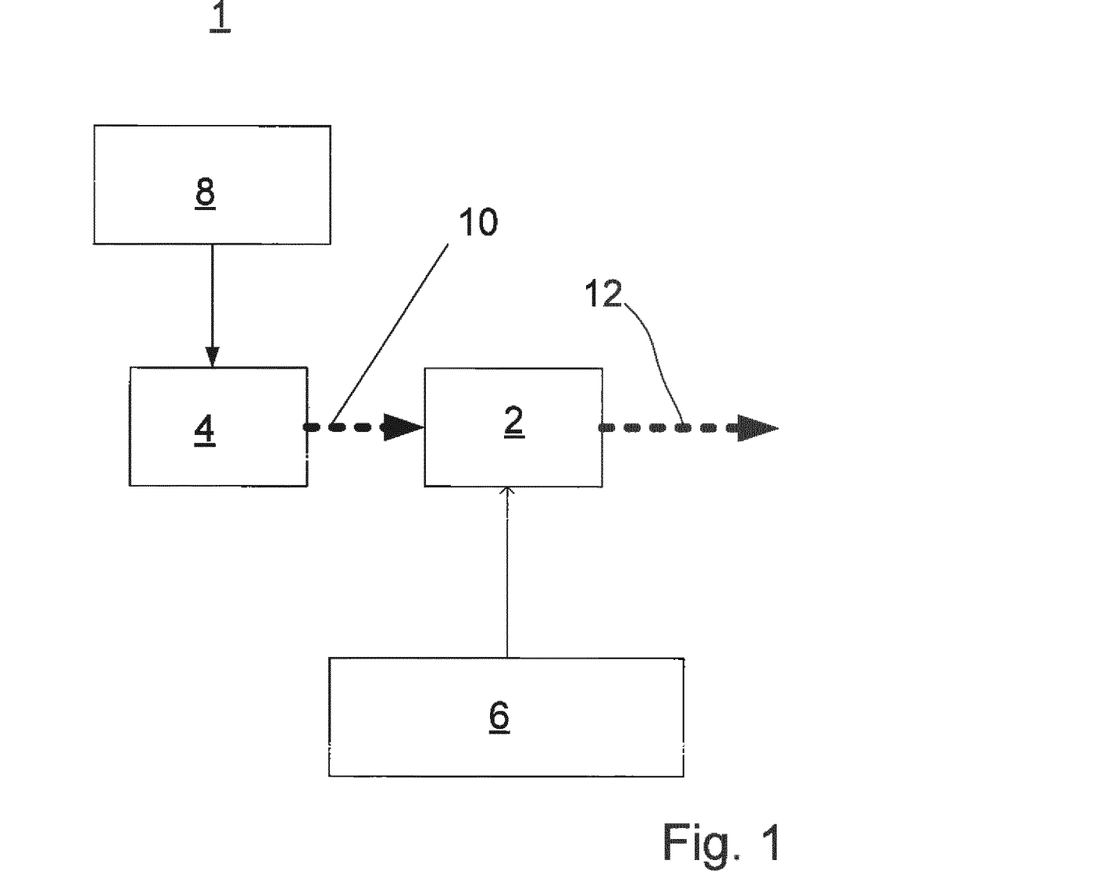
FIG. 1 is an exemplary embodiment in which a single mode laser is employed as a master laser to drive a gain switched slave (Fabry-Pérot) laser to produce an optical comb signal.

The comb source 1, with reference to FIG. 1, comprises a multi-modal semiconductor laser for example a Fabry-Pérot Perot semiconductor laser 2 which acts as a slave. The multi-modal semiconductor laser is injected with light 10 from a further laser 4 acting as the master. This further laser is a suitable single mode laser. Examples of suitable single mode lasers include; distributed feedback lasers, vertical cavity surface emitting lasers, discrete mode lasers and those single mode lasers that exhibit wavelength tunability such as tunable external cavity lasers, sampled grating distributed feedback lasers, grating-assisted co-directional coupler with sampled reflector and slotted Fabry-Pérot lasers. The Fabry-Pérot semiconductor laser is driven by a control circuit 6. This control circuit is employed to gain switch the Fabry-Pérot laser. Gain switching is performed by driving the Fabry-Pérot laser with an RF signal and a DC bias suitably provided by the control circuit. The frequency of the RF signal determines the spacing between fingers of the comb. The resulting output from the Fabry-Pérot laser is a comb, i.e. a coherent multi-carrier signal in which the spacing between adjacent carriers corresponds to the frequency of the RF signal. To ensure proper operation, the level of the DC bias and RF signal may require adjustment to ensure that a coherent signal is produced. Suitably, the laser bias current is selected to be close to the threshold current of the laser device. Suitably, the DC bias is within 20% of the threshold current.

Similarly, the RF signal is suitably selected to be a substantially sinusoidal signal. The frequency of the RF signal is suitably selected to be close to the relaxation oscillation frequency of the laser and preferably within 25% of the relaxation oscillation frequency of the laser. By operating the laser at a frequency close to its relaxation oscillation frequency, the build up of each pulse occurs close to the end of the preceding pulse, so that coherence is maintained between consecutive pulses. This effect causes the inter-pulse timing jitter to be minimised and the phase relationship of the optical signal to be maintained between the consecutive pulses. A further explanation of this approach may be found in U.S. patent application Ser. No. 13/257,917 the entire contents of which are hereby incorporated by reference.

Figure 2:
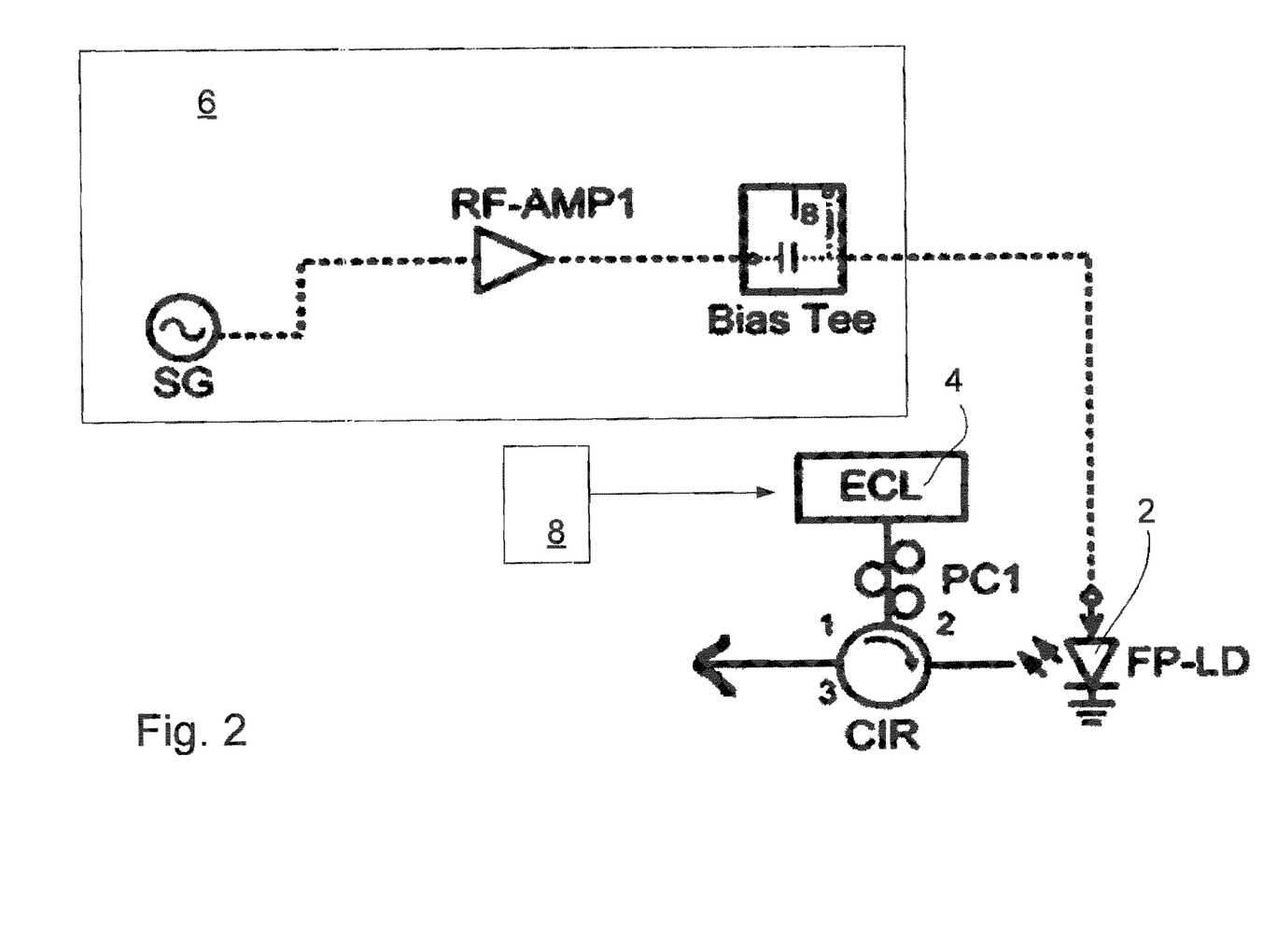
FIG. 2 is an exemplary detailed implementation of FIG. 1.

The control circuit suitably comprises, as shown in the exemplary arrangement of FIG. 2, an RF source providing an RF signal and a DC bias circuit providing a DC bias current. The signal from the RF source may be amplified by one or more amplifiers. Suitably, the RF signal and DC bias are combined together, for example in a bias tee, and the combined signal provided as a drive signal to the Fabry-Pérot laser.

The single mode laser 4 is driven by a control circuit 8, which may be integrated with or separate to the control circuit 6. The control circuit for the single mode laser suitably drives the single mode laser. Tuning of the comb may be achieved by appropriate control of the wavelength of the single mode laser. Control of the single mode laser is suitably effected by the control circuit of the single mode laser.

Light from the single mode laser is suitably coupled into the lasing cavity of the Fabry-Pérot laser. This may be achieved in a number of different ways, including for example using a circulator, as shown in the exemplary implementation of FIG. 2. An optical circulator is a fiber-optic component that may be used to separate optical signals that travel in opposite directions in an optical fiber. Optical circulators, which would be familiar to those skilled in the art, are three-port devices designed such that light entering any port exits from the next. This means that if light enters port 1 it is emitted from port 2, and light entering port 2 comes out port 3. Thus in the arrangement shown, the single mode laser 4 is optically coupled to the first port (port 1) of the circulator. The Fabry-Pérot laser is optically coupled to the second port (port 2). Thus light from the single mode laser 4 enters the circulator at port 1 and exits at port 2 where it is externally injected into the lasing cavity of the Fabry-Pérot laser through the front facet of the laser. Light emitting from the front facet of the Fabry-Pérot laser enters the circulator at port 2 and exits at port 3 which provides the comb output. A polarization controller PC1 may be provided between the Single Mode Laser and the Fabry-Pérot laser to ensure optimum performance of the injected (slave) laser. More specifically, the polarization controller (PC 1) is employed to align the polarization state of the injected light from the master single mode laser with the optical waveguide of the slave laser.

It will be appreciated that a wide variety of other techniques, arrangements and devices may be employed to externally inject the light from single mode laser into the lasing cavity of the Fabry-Pérot laser. For example, the two lasers may be provided together on the same substrate with light from the single mode laser injected into the lasing cavity of the Fabry-Pérot laser through the rear facet using an appropriate optical coupling technique which allows for the light to pass into the Fabry-Pérot laser but restricts light passing the other way. An advantage of this approach is that the overall size and complexity of the arrangement may be reduced as there is no need for a polarization controller or the circulator and the entire arrangement may be provided together on a common substrate.

Whilst the tunable Single Mode Laser may be employed to tune the Fabry-Pérot laser, additional tuning may be provided using temperature control of the Fabry-Pérot laser. The use of temperature control for laser devices would be familiar to those skilled in the art. The degree of tuning provided by temperature control is very small compared to that available using the Single Mode Laser. In one arrangement, the tunable Single Mode Laser may be employed to effect course tuning with fine tuning effected by temperature control of the Fabry-Pérot laser.

Additionally, some adjustment may need to be made to ensure that an optical comb is produced. Thus for example, it is desirable that the wavelength tunable single mode laser is suitably detuned from the operating mode of the Fabry-Pérot laser and hence the operating mode of the comb. The level of detuning required is small so as to maintain injection locking. Suitably the wavelength difference (degree of detuning) between the injected light from the chosen operating mode of the Fabry Perot is between 0.01 nm and 0.3 nm. It is possible to obtain different effects in the resulting comb by changing the nature of the detuning. For example, experimentally it has been found that by having the injected wavelength detuned below that of the chosen (operating) Fabry Perot mode, the resulting comb is asymmetric. In contrast, when it is tuned above, the comb is broader and flatter.

At the same time, the light injected into the cavity may require adjustment. Suitably, the light actually injected into the cavity is between −5 dBm (0.316 mW) and −20 dBm (0.01 mW).

An enhancement may be achieved, by including a phase modulator in the output path after the circulator. Equally it may be employed in arrangements where a different technique to that of the circulator is employed to inject the light from the single mode laser into the Fabry-Pérot laser. The external phase modulator is driven by the same RF source used to gain switch the Fabry-Pérot laser. For example, as shown in the arrangement of FIG. 2, a splitter is used to separate the output from the RF source in two. The first part is then amplified by amplifier RF-AMP1 which is used, as described previously, to gain switch the Fabry-Pérot laser. The second part is employed as a modulation signal, through a suitable amplifier RF_AMP2, to the phase modulator which externally modulates the light from the comb source in order to expand the original comb. An RF delay line (DL) may be employed to optimize the phase of the modulation signal applied to the modulator. A polarization controller PC2 may be positioned in the output path between the circulator and the modulator to ensure optimum operation of the arrangement. The external modulator may, for example, be a phase modulator. The external modulator increases the number of frequency components, while maintaining the flatness of the spectral envelope and the extinction ratio. In To confirm the efficacy of the systems and arrangements described herein, some experimental results are now presented in which a highly coherent multi-carrier signal (comb) has been generated consisting of seven clearly resolved 10 GHz tones generated within 3 dB of the spectral envelope peak with an extinction ratio in excess of 50 dB. This comb is tunable over a wavelength range of 40 nm (1530 to 1570 nm). Optical linewidth of the tones across the whole tunability span was measured to be lower than 200 kHz. Expansion of the number of frequency comb lines (14 within 3 dB window) and improvement in the spectral intensity flatness was achieved using the phase modulation technique described above.

Figure 3:
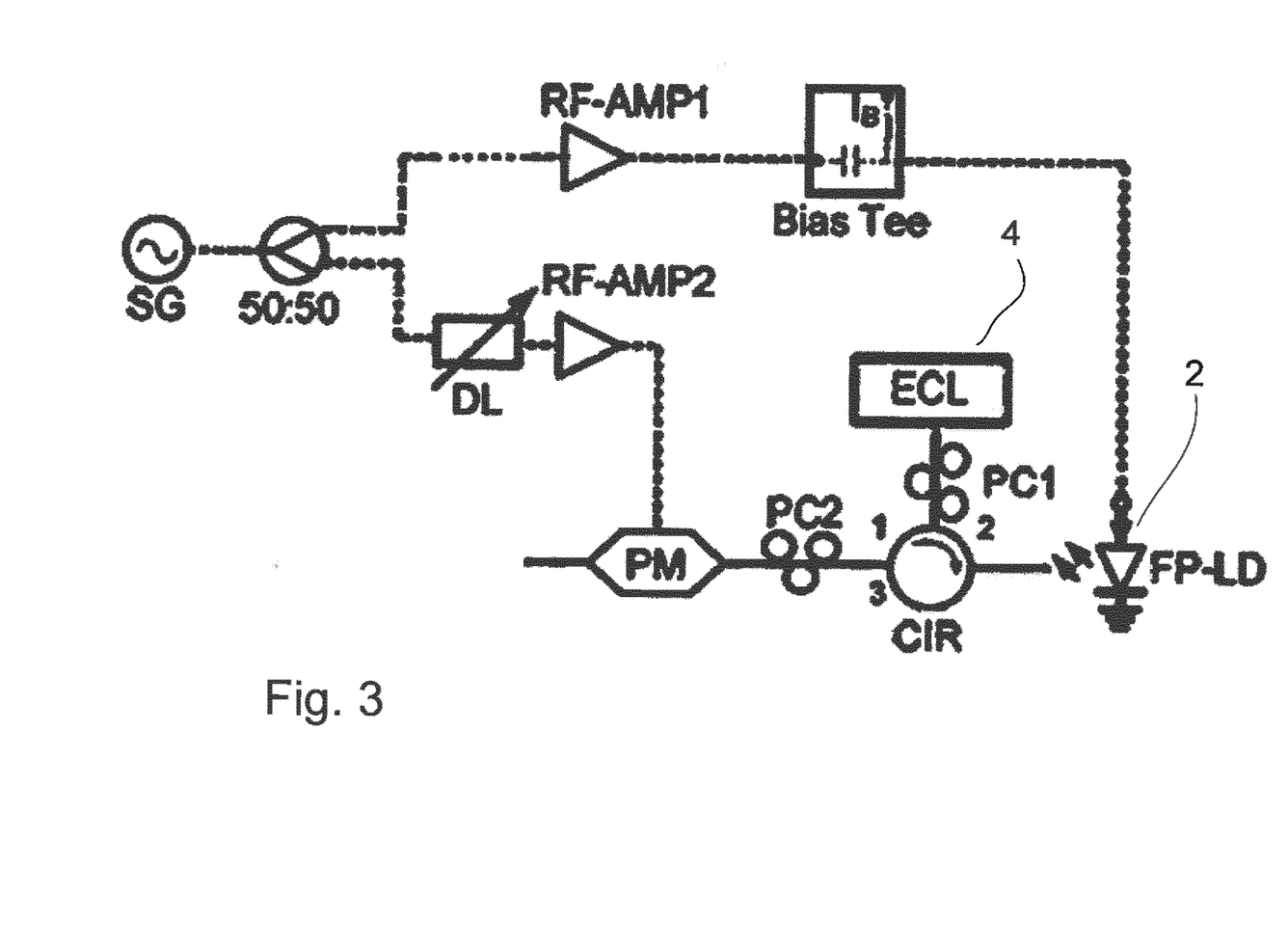
FIG. 3 is a modified implementation of FIG. 2.
Figure 4:
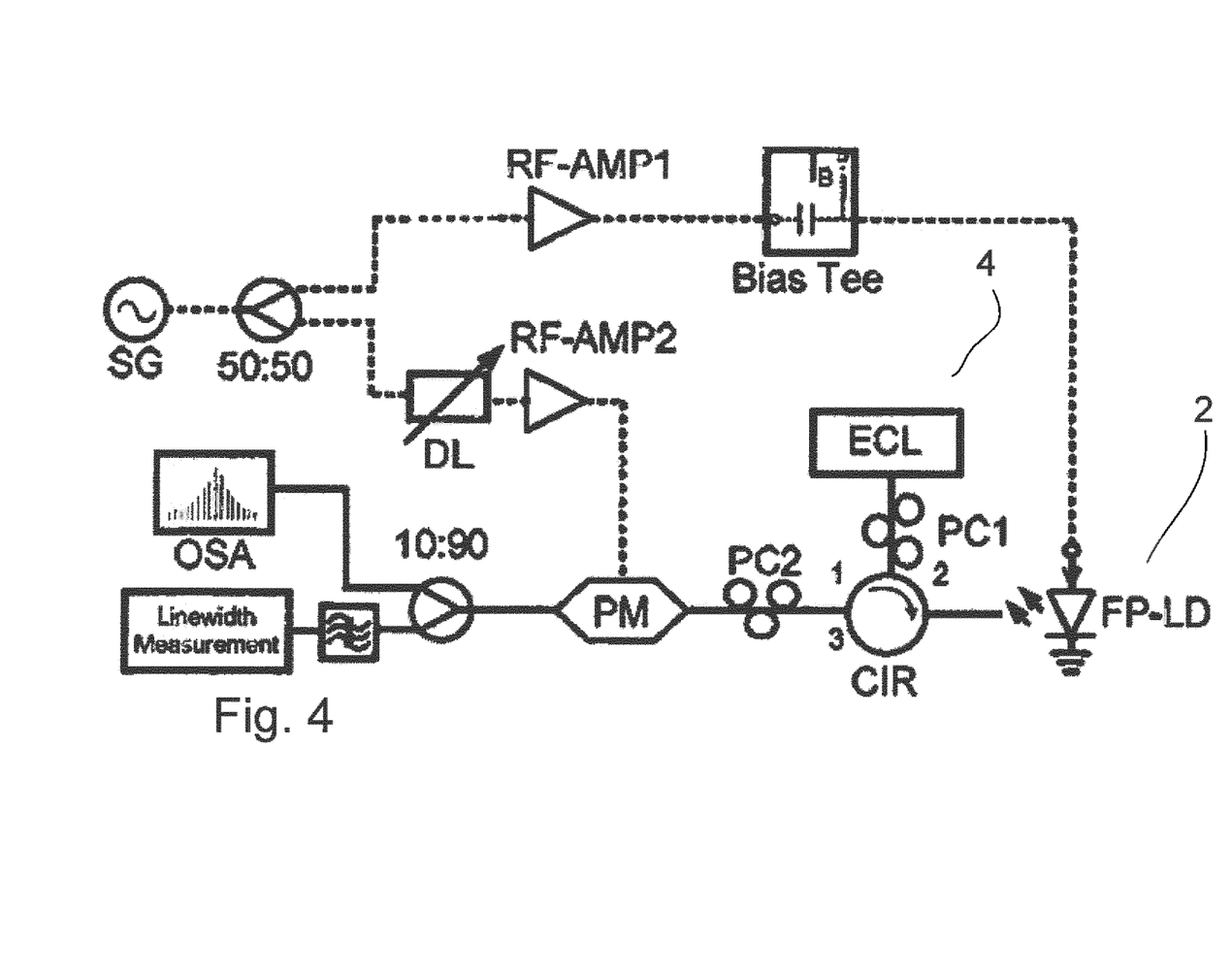
FIG. 4 is an experimental set-up used to provide results confirming the efficacy of the techniques of the present application.

The experimental setup for the tunable comb generation, shown in FIG. 4 corresponds to the arrangement of FIG. 3 with measurement devices attach to measure the results. The FP laser diode employed in the experiment was 200 μm long. The diode was encased in a high speed butterfly package. The use of such a packet facilitated high speed direct modulation (10 GHz). The diode emitted in the 1.5 μm window and had a threshold current of approximately 8 mA at room temperature. The small signal modulation bandwidth was measured, at room temperature, to be around 11 GHz when biased at 40 mA ($5*I_{threshold}$). A tunable external cavity laser (ECL) was employed as the single mode laser. This laser acted as the master and injected light into the slave laser (FP-LD) via a circulator. This enabled the seeding of 20 longitudinal modes of the FP laser thereby achieving single mode operation at these selected wavelengths. A polarization controller (PC 1) was employed to align the polarization state of the injected light with the optical waveguide of the slave laser. Gain switching of the externally injected laser is achieved by applying an amplified 10 GHz sinusoidal RF signal (24 dBm) in combination with a dc bias ($5*I_{threshold}$) to the laser via a bias tee. The output of the FP-LD was then passed through a phase modulator (PM) for further expansion and shaping of the gain-switched frequency comb. A second polarization controller (PC 2) was used at the input to the phase modulator. The PM is driven by an amplified sinusoidal waveform drawn from the same signal generator used for gain-switching. An RF delay line (DL) was employed to optimize the phase of the applied modulation signal. The modulation level of the signal driving the PM was set at around 12 V which corresponds to 3Vπ (Vπ≈4 V) where Vπ (or Vpi) can be defined as the applied voltage that causes the signals to be π radians out of phase. An optical coupler (90:10) was placed after the PM, with 10% of the signal being used to record the generated optical frequency comb with the aid of an optical spectrum analyzer (OSA) that has a 20 MHz resolution and 90% of the signal being sent to a linewidth measurement scheme which consists of a delayed self-heterodyne setup.

Figure 5:
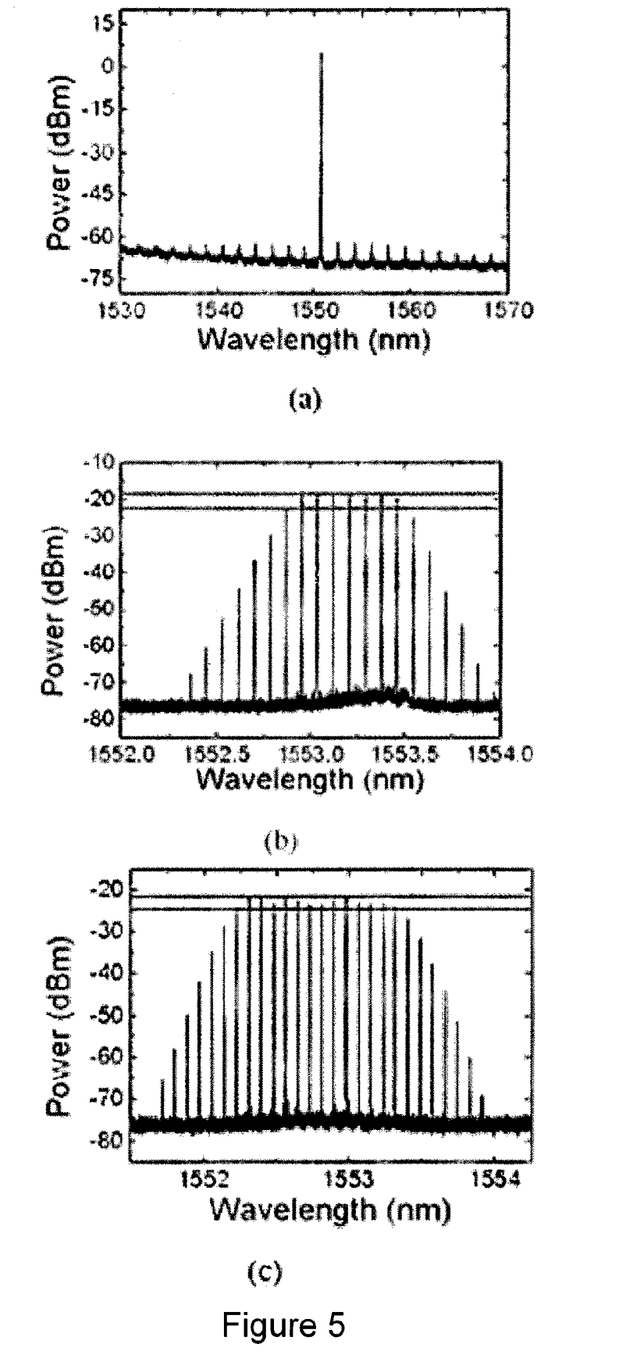
FIG. 5 are exemplary experimental results obtained from the arrangement of FIG. 4.

The longitudinal mode spacing of the FP laser was approximately 2 nm which corresponds to the lasers cavity length of 200 μm. With precise injection into a particular FP mode, single mode operation of the laser was obtained. By tuning the ECL injection over a wide wavelength range, over 20 single mode operation points can be realized with side-mode-suppression-ratios (SMSR) greater than 60 dB, an example of single mode injection-locked operation at 1551 nm with SMSR of 60 dB is depicted in FIG. 5(a). Gain switching at these 20 single mode operating points results in the generation of a highly coherent frequency comb consisting of approximately 7 clearly resolved 10 GHz tones generated within 3 dB of the spectral envelope peak with an extinction ratio in excess of 50 dB, as presented in FIG. 5(b). Subsequently, the expansion of this comb when passed through the phase modulator for each of the above mentioned operating points is presented in FIG. 5(c). The number of tones is doubled after comb expansion provided by the phase modulation. Similar results are achieved at all other seeded wavelengths, and are demonstrated in FIG. 6 for seeded wavelengths of 1532 nm, 1553 nm and 1571 nm. (a) (b) (c)

Figure 6:
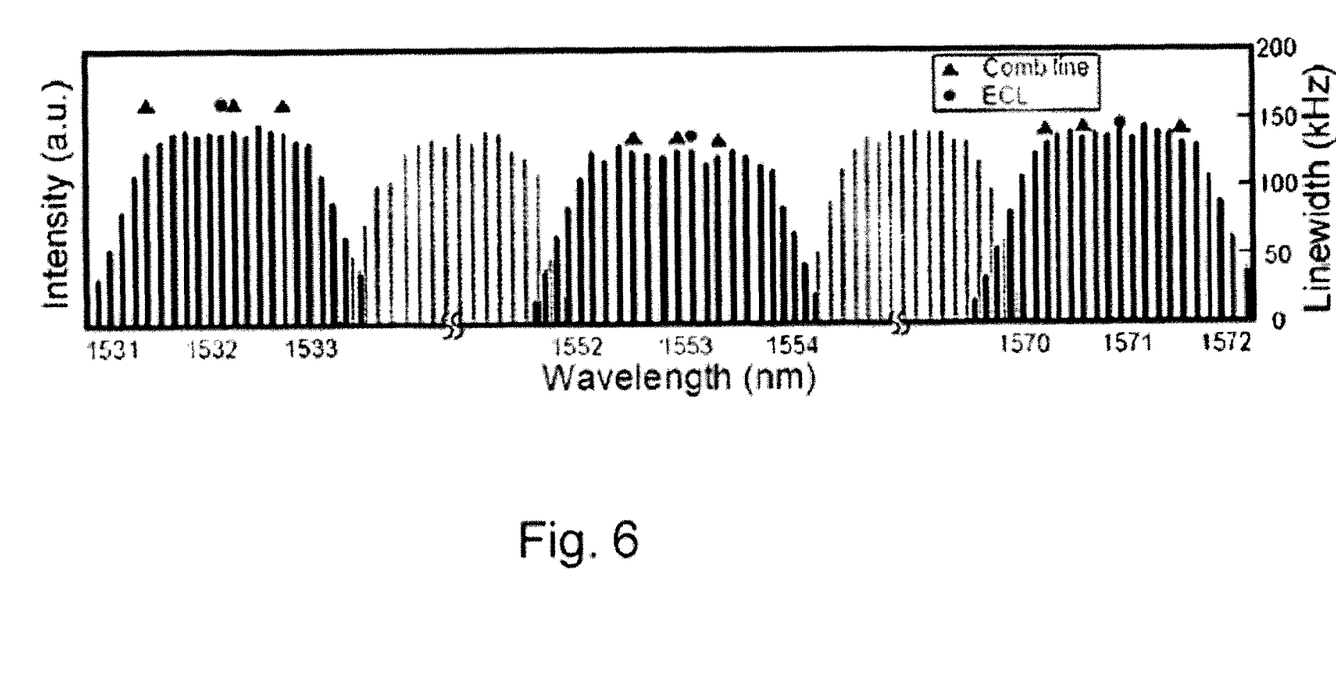
FIG. 6 are further exemplary experimental results obtained from the arrangement of FIG. 4.

After the comb expansion, the signal from the 90% arm of the coupler in the experimental set-up was sent to a tunable optical band-pass filter and subsequently into the delayed self heterodyne linewidth measurement scheme. The tunable optical band-pass filter, with a 3 dB bandwidth of 10 GHz, was used to select out individual comb lines from each of the operating points to enable the linewidth measurement of the tones of the comb. The achieved results are illustrated in FIG. 6.

Here again, the results are displayed for the same 3 operating points chosen above. The comb lines exhibited a linewidth of 170 kHz at 1532 nm, 130 kHz at 1552 nm and 130 kHz at 1571 nm. The linewidth of the ECL at each of the chosen operating points is also measured. The results are 170 kHz at 1532 nm, and 130 kHz at both 1552 nm and 1571 nm. It can be seen that the optical linewidth of the individual comb lines follow the linewidth of master laser. The narrow linewidth of the comb indicates superior phase noise characteristics thereby making such a comb source a suitable transmitter for systems utilizing advanced modulation formats.

The words comprises/comprising when used in this specification are to specify the presence of stated features, integers, steps or components but does not preclude the presence or addition of one or more other features, integers, steps, components or groups thereof.

What is claimed is:

1. A wavelength tunable optical comb source, providing an output, comprising:
   a) a Fabry-Pérot semiconductor laser having a lasing cavity;
   b) a RF source providing a RF signal for gain switching of the Fabry-Pérot semiconductor laser;
   c) a DC bias source configured to provide a DC bias current to the Fabry-Pérot semiconductor laser; and
   d) a tunable single mode laser,
   e) an optical circulator comprising at least three ports, the optical circulator being optically coupled to the tunable single mode laser at a first port and optically coupled to the Fabry-Pérot semiconductor laser at a second port so that the comb source is configured such that the output from the single mode laser is injected into the lasing cavity of the Fabry-Pérot semiconductor laser with the output of the comb source provided by the Fabry-Pérot semiconductor laser from a third port of the optical circulator.

2. A wavelength tunable optical comb source according to claim 1, wherein the tunable single mode laser is detuned with respect to the comb output.

3. A wavelength tunable optical comb source according to claim 1, wherein the tunable single mode laser is detuned with respect to the comb output by a wavelength difference of between 0.01 nm and 0.2 nm.

4. A wavelength tunable comb source according to claim 1, wherein the tunable single mode laser is configured to provide an optical power output into the lasing cavity of the Fabry-Pérot semiconductor laser in the range of −5 dBm and −20 dBm.

5. A wavelength tunable comb source according to claim 1, further comprising a polarization controller positioned between the tunable single mode laser and the first port for adjusting the polarization of the light from the tunable single mode laser.

6. A wavelength tunable comb source according to claim 1, wherein the comb source is configured to prevent light from the Fabry-Pérot semiconductor laser passing to the single mode laser.

7. A comb source according to claim 6, wherein the comb source is configured to allow the injected light from the single mode laser to enter the cavity of the Fabry-Pérot semiconductor laser through the rear facet of the Fabry-Pérot semiconductor laser.

8. A wavelength tunable comb source according to claim 1, wherein the single mode laser is selected from one of the following:
   a) a single mode laser exhibiting wavelength tunability;
   b) a tunable external cavity laser;
   c) a sampled grating distributed feedback laser;
   d) a grating-assisted co-directional coupler with sampled reflector; and
   e) a multi-section slotted Fabry-Pérot laser, and
   f) an integrated DFB laser (for example an ITLA laser).

9. A wavelength tunable comb source according to claim 1, wherein the RF source is provided to as a drive signal to the Fabry-Pérot semiconductor laser with the bias signal through a bias Tee.

10. A wavelength tunable comb source according to claim 1, further comprising a phase modulator for modulating the comb output with the RF signal from the RF source.

11. A comb source according to claim 10, further comprising a polarization controller for adjusting the polarization of the comb output before the phase modulator.

12. A wavelength tunable comb source according to claim 10, further comprising a RF delay for delaying the RF signal provided to the phase modulator.

13. A method of providing a wavelength tunable optical comb comprising the steps of:
   a) gain switching a Fabry-Pérot semiconductor laser with a RF signal where the Fabry-Pérot semiconductor laser is biased with a DC bias; and
   b) seeding the Fabry-Pérot semiconductor laser with light from a tunable single mode laser by optically coupling an optical circulator comprising at least three ports to the tunable single mode laser at a first port and optically coupling the optical circulator to the Fabry-Pérot semiconductor laser at a second port, wherein the output from the Fabry-Pérot semiconductor laser provides an optical comb output through a third port of the optical circulator.

14. A method of providing a wavelength tunable optical comb in accordance with claim 13, further comprising detuning the tunable single mode laser from a selected mode of the Fabry-Pérot semiconductor laser.

15. A method of providing a wavelength tunable optical comb in accordance with claim 4, wherein the tunable single mode laser is detuned with respect to the comb output by a wavelength difference of between 0.01 nm and 0.2 nm.

16. A method of providing a wavelength tunable optical comb according to claim 13, wherein the tunable single mode laser is operated to provide an optical power output into the lasing cavity of the Fabry-Pérot semiconductor laser in the range of −5 dBm and −20 dBm.

17. A method of providing a wavelength tunable optical comb according to claim 13, wherein the single mode laser is selected from one of the following:
   a) a single mode laser exhibiting wavelength tunability;
   b) a tunable external cavity laser;
   c) a sampled grating distributed feedback laser;
   d) a grating-assisted co-directional coupler with sampled reflector; and
   e) a multi-section slotted Fabry-Pérot laser, and
   f) an integrated DFB laser (for example an ITLA laser).

18. A wavelength tunable optical comb source comprising:
   a) a Fabry-Pérot semiconductor laser having a lasing cavity;
   b) a RF source providing a RF signal for gain switching of the Fabry-Pérot semiconductor laser;
   c) a DC bias source configured to provide a DC bias current to the Fabry-Pérot semiconductor laser;
   d) a tunable single mode laser, wherein the comb source is configured such that the output from the single mode laser is injected into the lasing cavity of the Fabry-Pérot semiconductor laser and the output of the comb source is provided by the Fabry-Pérot semiconductor laser, and wherein the comb source is further configured to prevent light from the Fabry-Pérot semiconductor laser passing to the single mode laser.

19. A wavelength tunable optical comb source comprising:
   a) a Fabry-Pérot semiconductor laser having a lasing cavity;
   b) a RF source providing a RF signal for gain switching of the Fabry-Pérot semiconductor laser;
   c) a DC bias source configured to provide a DC bias current to the Fabry-Pérot semiconductor laser;
   d) a tunable single mode laser, wherein the comb source is configured such that the output from the single mode laser is injected into the lasing cavity of the Fabry-Pérot semiconductor laser and the output of the comb source is provided by the Fabry-Pérot semiconductor laser, and e) a phase modulator for modulating the comb output with the RF signal from the RF source.

\* \* \* \* \*